United States Patent
Ke et al.

(10) Patent No.: US 7,733,008 B2
(45) Date of Patent: Jun. 8, 2010

(54) ORGANIC LIGHT EMITTING DIODES (OLEDS) INCLUDING A BARRIER LAYER AND METHOD OF MANUFACTURE

(75) Inventors: Lin Ke, Singapore (SG); Senthil Kumar Ramadas, India (IN); Soo Jin Chua, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 237 days.

(21) Appl. No.: 10/497,427

(22) PCT Filed: Nov. 27, 2002

(86) PCT No.: PCT/SG02/00276

§ 371 (c)(1),
(2), (4) Date: May 28, 2004

(87) PCT Pub. No.: WO03/047317

PCT Pub. Date: Jun. 5, 2003

(65) Prior Publication Data

US 2005/0012448 A1    Jan. 20, 2005

(30) Foreign Application Priority Data

Nov. 28, 2001    (SG) .............................. 200107343-6

(51) Int. Cl.
*H01J 1/62* (2006.01)
*H01J 63/04* (2006.01)

(52) U.S. Cl. ..................... 313/503; 313/506; 313/505; 313/498; 313/483; 428/690; 428/917

(58) Field of Classification Search .......... 313/503–504
See application file for complete search history.

(56) References Cited

U.S. PATENT DOCUMENTS

| 4,356,429 | A |   | 10/1982 | Tang |
| 5,645,948 | A | * | 7/1997  | Shi et al. ..................... 313/504 |
| 5,693,956 | A | * | 12/1997 | Shi et al. ..................... 257/40 |
| 5,770,920 | A | * | 6/1998  | Eckersley et al. .......... 313/506 |

(Continued)

FOREIGN PATENT DOCUMENTS

EP    327355 A  *  8/1989

(Continued)

OTHER PUBLICATIONS

International Search Report, dated Jan. 31, 2003.

(Continued)

*Primary Examiner*—Peter J Macchiarolo
*Assistant Examiner*—Natalie K Walford
(74) *Attorney, Agent, or Firm*—TraskBritt

(57) ABSTRACT

An Organic Light Emitting Diode (OLED) which is adapted to inhibit the formation and growth of non-emissive areas known as "dark spots." The OLED comprises an anode disposed on a substrate, a cathode, an electroluminescent (EL) layer disposed between the anode and the cathode and a hole transport layer disposed between the anode and the EL layer. The OLED has one or more dielectric organic barrier layers disposed between one or more of the OLED's layers. These barrier layers are made from an organic polymer and are adapted to resist permeation by oxygen and moisture and to inhibit metal migration.

45 Claims, 3 Drawing Sheets

U.S. PATENT DOCUMENTS

| | | | | |
|---|---|---|---|---|
| 5,796,120 | A | * | 8/1998 | Summers et al. ............... 257/30 |
| 6,150,187 | A | | 11/2000 | Zyung et al. |
| 6,198,217 | B1 | * | 3/2001 | Suzuki et al. ............... 313/504 |
| 6,558,820 | B2 | * | 5/2003 | Raychaudhuri et al. ..... 313/504 |
| 6,690,108 | B2 | * | 2/2004 | Yamaguchi et al. ......... 313/504 |
| 2001/0041268 | A1 | | 11/2001 | Arai et al. |
| 2002/0057055 | A1 | * | 5/2002 | Yamazaki et al. ........... 313/506 |
| 2002/0167025 | A1 | * | 11/2002 | Nagao et al. ................ 257/200 |
| 2003/0087126 | A1 | * | 5/2003 | Ishida et al. ................. 313/504 |

FOREIGN PATENT DOCUMENTS

| | | | |
|---|---|---|---|
| EP | 0777280 | A2 | 6/1997 |
| JP | 10-214683 | A | 8/1998 |
| JP | 10214683 | A * | 8/1998 |
| JP | 11-283752 | A | 10/1999 |
| JP | 2000-030871 | A | 1/2000 |
| JP | 2000-068067 | A | 3/2000 |
| JP | 2001076884 | A * | 3/2001 |
| JP | 2001076886 | A * | 3/2001 |
| WO | WO 90/13148 | | 11/1990 |

OTHER PUBLICATIONS

Young-Eun Kim, Heuk Park, and Jang-Joo Kim—Enhanced quantum efficiency in polymer electroluminescence devices by inserting a tunneling barrier formed by Langmuir-Blodgett films. (Journal of Applied Physics Letters, vol. 69, No. 5, p. 599, Jul. 29, 1996).

F. Li and H. Tang, J. Anderegg, J. Shinar—Fabrication and electroluminescence of double-layered organic light-emitting diodes with the $Al_2O_3$/Al cathode. (Journal of Applied Physics Letters, vol. 70, No. 10, p. 1233, Mar. 10, 1997).

L .S. Hung, C. W. Tang, and M. G. Mason—Enhanced electron injection in organic electroluminescence devices using an Al/LiF electrode. (Journal of Applied Physics Letters, vol. 70, No. 2, p. 152, Jan. 13, 1997).

L.S. Hung, L. S. Liao, C. S. Lee, and S. T. Lee—Sputter deposition of cathodes in organic light emitting diodes. (Journal of Applied Physics, vol. 86, No. 8, p. 4607, Oct. 15, 1999).

Soo-Jin Chua, Lin Ke, Ramadas Senthil Kumar, and Keran Zhang—Stabilization of electrode migration in polymer electroluminescent devices. (Journal of Applied Physics Letters, vol. 81, No. 6, p. 1119, Aug. 5, 2002).

Lin Ke, Soo-Jin Chua, Keran Zhang, and Nikolai Yakovlev—Degradation and failure of organic light-emitting devices. (Journal of Applied Physics Letters, vol. 80, No. 12, p. 2195, Mar. 25, 2002).

Lin Ke, Soo-Jin Chua, Keran Zhang, and Peng Chen—Bubble formation due to electrical stress in organic light emitting devices. (Journal of Applied Physics Letters, vol. 80, No. 2, p. 171, Jan. 14, 2002).

Furong Zhu, Beeling Low, Keran Zhang, and Soo Jin Chua—Lithium-fluoride-modified indium tin oxide anode for enhanced carrier injection in phenyl-substituted polymer electroluminescent devices. (Journal of Applied Physics Letters, vol. 79, No. 8, p. 1205, Aug. 20, 2001).

Lin Ke, Ramadas Senthil Kumar, Keran Zhang, Soo Jin Chua, and A.T.S. Wee—Organic light emitting devices performance improvement by inserting thin parylene layer. (Synthethic Metals, 140 (2004) 295-299).

English Translation of JP 10214683 A, dated Aug. 1998 to Sano (20 pages).

DuPont Fluoropolymers, Food Processing and Industrial Bakeware Coatings. http://www.dupont.com/teflon/bakeware/power.html, Copyright © 2003 E.I. duPont de Nemours and Company (1 page).

DuPont Teflon®, Industrial Coatings, http://www.dupont.com/teflon/coatings/basic_types.html, Copyright © 2003 E.I. duPont de Nemours and Company (2 pages).

* cited by examiner

ORGANIC LIGHT EMITTING DIODES (OLEDS) INCLUDING A BARRIER LAYER AND METHOD OF MANUFACTURE

TECHNICAL FIELD

The present invention relates to Organic Light Emitting Diodes (OLEDs) and, in particular, to an OLED which is adapted to inhibit the formation and growth of non-emissive areas known as "dark spots."

The invention is particularly suitable for OLEDs used in flat panel displays, and will be described hereinafter with reference to this application. However, it will be appreciated that the invention is not limited to this particular field of use.

BACKGROUND ART

A typical OLED consists of two electrodes with one or more polymer layers disposed between the electrodes. As shown in FIG. 1, these devices commonly include the following layers, arranged in the following order:

(i) a substrate 2 often made from plastic or glass;
(ii) an anode 3 disposed on the substrate and commonly made from a transparent conductive material, which may be an organic material or an inorganic oxide such as Indium Tin Oxide (ITO);
(iii) a hole transport layer 5 disposed on the anode;
(iv) an electroluminescent (EL) layer 6 disposed on the hole transport layer; and
(v) a cathode 8 disposed on the EL layer, the cathode being made from a first layer 9 of Calcium or Magnesium and a second layer 10 of Silver or Aluminum.

The anode 3 is biased positively with respect to the cathode 8. In use, the electrons and holes are injected into the EL layer 6, where they migrate in the electric field until they recombine to produce a photon. The total organic layer thickness is usually around 50-150 nm, and the bias is about 2-20 V. The anode 3 is typically transparent and the work functions of the cathode materials are chosen to match the energy levels of the polymer HOMO for the anode and LUMO for the cathode. Hence, the materials most widely used for OLED cathodes are calcium, magnesium and aluminum and lithium alloys.

In recent times considerable improvements have been made in the materials and device architecture of OLEDs, which has resulted in devices with luminance values exceeding 100,000 cd/m$^2$ and external quantum efficiencies in excess of 4%. These new generation devices have been found to be useful in large area illuminators and flat panel displays.

Although remarkably stable electroluminescent (EL) devices have been demonstrated operating in inert environments, the lifetimes of such devices have been limited by the formation and growth of non-emissive areas known as "dark spots."

A number of factors contribute to the formation and growth of dark spots. One such factor is cathode defects such as pinholes. These pinholes are often formed during resistive-heating evaporation. The oxidized cathode reduces the electron injection efficiency of the device and a higher driving bias is therefore needed. This significantly increases the chance of local shorting. Although sputtering is one of the methods commonly used in the semiconductor industry for the deposition of cathodes, this technique has, until now, not been suitable for OLEDs. This is because OLEDs are extremely sensitive and are damaged by the radiation, charging, heating and ion bombardment involved in the sputtering process. Although sputtering produces cathodes with few or no pinholes, it has not been used on OLEDs because of the damage caused by the technique.

Another factor in dark spot formation and growth is the evolution of oxygen and moisture in the OLED materials and its permeation through the device during operation. The diffusion of moisture and oxygen through the layers of the OLED is a significant cause of the growth of dark spots on the cathode. Magnesium and Calcium are often used as cathode materials in OLED devices because of their low work function. However, Calcium and Magnesium are very sensitive to oxygen and water vapor. The dark spot and defect growths are due to the oxygen and moisture produced within the OLED materials which then permeate through the various layers and substrates and reacts with the electrodes.

An additional factor in dark spot growth is the migration of the electrode materials during electrical stress. This metal migration causes peaks of electrical shorts and strong electrical fields in various parts of the OLED.

A further factor which contributes to the formation of dark spots is local heating. This heating is often caused by high currents. It expedites material failure, increases the possibility of inter-diffusion of the organic layers and leads to dark spot growth.

A further problem faced by prior art OLEDs is that they do not have very good polymer stability. One of the more significant degradation mechanisms in conjugated polymers has been found to be photo-oxidation. Such photo-oxidation induces the chain scission of the vinyl double bond on the polymer backbone thereby reducing the conjugation length by the formation of carbonyl groups, resulting in lower photoluminescence efficiencies.

In recent times it has been found that the performance of OLEDs is enhanced not only by the proper selection of organic materials but also by the efficient carrier injection of electrodes and the controlled electron-hole recombination within a well-defined zone. Research that has focused on increasing the charge injection and carrier confinement has led to significant improvements in device performance.

FIG. 2 shows an advanced form of such prior art OLEDs which consists of a multi-layer, high efficiency, structure. In addition to the layers labeled with common numerals to those of FIG. 1, the advanced prior art OLED also includes an electron injecting layer 15 and a dielectric layer 14.

The electron injecting layer 15 is disposed between the electroluminescent (EL) layer 6 and the cathode 8 and serves to efficiently control hole and electron injection.

The dielectric layer 14 is disposed between the anode 3 and the hole transport layer 5. If the thickness of the dielectric layer 14 is within tunneling thickness, the effective barrier to electron injection is lowered and the injection of holes to the emitting layer is reduced. As a result, this lowering of the effective barrier to carrier injection leads to more balanced injection of electrons and holes and the quantum efficiency of the OLED increases.

This more advanced prior art OLED device therefore exhibits superior luminescence and efficiency. However, because these advanced OLEDs also exhibit dark spot formation and growth they therefore have a relatively short lifespan.

There is therefore a need for an improved OLED which is adapted to inhibit the formation and growth of dark spots.

DISCLOSURE OF THE INVENTION

In a first aspect, the present invention provides an organic light emitting diode (OLED) comprising:
(a) an anode disposed on a substrate;
(b) a cathode;

(c) an electroluminescent (EL) layer disposed between the anode and the cathode;
(d) a hole transport layer disposed between the anode and the EL layer; and
(e) at least one dielectric organic barrier layer disposed between one or more of:
  (i) the anode and the hole transport layer;
  (ii) the hole transport layer and the EL layer; and
  (iii) the EL layer and the cathode;
  the barrier layer being adapted to at least one of:
    (A) resist permeation by oxygen;
    (B) resist permeation by moisture; and
    (C) inhibit metal migration.

Preferably, the OLED comprises a barrier layer disposed between the EL layer and the cathode. Alternatively, or additionally, the OLED comprises a barrier layer disposed between either:
(i) the anode and the hole transport layer; or
(ii) the hole transport layer and the EL layer.

Preferably, the OLED comprises two barrier layers, one being disposed between the EL layer and the cathode and the other barrier layer being disposed between either:
(i) the anode and the hole transport layer; or
(ii) the hole transport layer and the EL layer.

It is further preferred that one or more of the at least one barrier layer is substantially transparent in the visible wavelength range.

It is further preferred that the at least one barrier layer is adapted to inhibit metal ion migration under electrical fields. Each barrier layer preferably also has a moisture barrier property in the range of from 0.1 g/m$^2$/day to about 50 g/m$^2$/day at about 39° C. The thickness of each barrier layer preferably lies in the range of about 1 to about 20 nm.

Preferably, the OLED further comprises an encapsulation layer at least partially encapsulating the OLED, the encapsulation layer being adapted to resist permeation by oxygen and/or moisture.

In one form, the OLED further comprises a dielectric layer disposed between the anode and the hole transport layer and wherein the at least one barrier is disposed between one or more of:
(i) the anode and the dielectric layer; and
(ii) the dielectric layer and the hole transport layer.

This dielectric layer preferably has a thickness which is within electron tunneling range. This dielectric layer is adapted to lower the effective barrier height for electron injection and thereby enhance the luminescence quantum efficiency of the OLED.

In another form, the OLED further comprises an electron injecting layer disposed between the EL layer and the cathode and wherein the at least one barrier is disposed between one or more of:
(i) the EL layer and the electron injecting layer; and
(ii) the electron injecting layer and the cathode.

This other form of the invention may also include the dielectric layer referred to above.

Preferably, the organic barrier layer is at least partially made from a polymer and has a thickness in the range of 1 to 20 nm. More preferably, the barrier layer is deposited by any conventional coating technique including:
(i) spin coating;
(ii) vacuum deposition; or
(iii) chemical vapor deposition.

Preferably, the encapsulation layer is an organic encapsulation layer which is at least partially made from a polymer and has a thickness in the range of 1 nm to 30 μm. More preferably, the encapsulation layer is deposited by any conventional coating technique including:
(i) spin coating;
(ii) vacuum deposition; or
(iii) chemical vapor deposition.

Preferably, the polymer of the barrier layer and the encapsulation layer is selected from:
(i) polyimides;
(ii) TEFLON®; and
(iii) parylene.

TEFLON® is a trademark for polytetrafluoroethylene, a fluorinated ethylene propylene copolymer, a perfluoroalkoxy copolymer resin or a copolymer of ethylene and tetafluoroethylene.

Parylene is a particularly preferred polymer.

The substrate of the OLED should be adapted to resist permeation by oxygen and/or moisture. Also, it is further preferred that the substrate is at least partially made from a rigid or flexible material, such as plastic or glass.

The cathode and/or anode of the OLED is preferably at least partially made from one or more of the following cathode materials:
(i) organic metals;
(ii) inorganic metals;
(iii) organic metal oxides; and
(iv) inorganic metal oxides.

The anode is preferably formed of indium tin oxide (ITO).

The cathode is preferably formed of calcium, magnesium, silver, aluminum, alloys of two or more of these metals, or lithium alloys.

In a further aspect, the present invention provides an organic light emitting diode (OLED) adapted to inhibit the formation and/or growth of non-emissive areas comprising:
(a) an anode disposed on a substrate;
(b) a cathode;
(c) an electroluminescent (EL) layer disposed between the anode and the cathode;
(d) a hole transport layer disposed between the anode and the EL layer; and
(e) at least one dielectric organic barrier layer disposed between one or more of:
  (i) the anode and the hole transport layer;
  (ii) the hole transport layer and the EL layer; and
  (iii) the EL layer and the cathode;
  the barrier layer being adapted to at least one of:
    (A) resist permeation by oxygen;
    (B) resist permeation by moisture; and
    (C) inhibit metal migration.

Preferably, the OLED further comprises an encapsulation layer at least partially encapsulating the OLED, the encapsulation layer being adapted to resist permeation by oxygen and/or moisture.

According to a further aspect of the present invention, there is provided a method of manufacturing an organic light emitting diode (OLED) comprising:
(a) forming an anode on a substrate;
(b) forming a hole transport layer above the anode;
(c) forming an electroluminescent (EL) layer above the hole transport layer;
(d) forming a cathode above the EL layer; and
(e) at appropriate steps in the process, forming at least one dielectric organic barrier layer disposed between one or more of:
  (i) the anode and the hole transport layer;
  (ii) the hole transport layer and the EL layer; and
  (iii) the EL layer and the cathode, wherein the barrier layer is adapted to at least one of:
(A) resist permeation by oxygen;
(B) resist permeation by moisture; and
(C) inhibit metal migration.

The first barrier layer is preferably formed on the hole transport layer prior to formation of the EL layer. Alternatively, a barrier layer may be formed on the EL layer prior to formation of the cathode.

It is particularly preferred that a first barrier layer is formed on the anode and a second barrier layer is formed on the EL layer. In a further alternative embodiment, the first barrier layer may be formed on the hole transport layer and the second barrier layer may be formed on the EL layer.

Each barrier layer may be deposited by any conventional coating technique including:
(i) spin coating;
(ii) vacuum deposition; or
(iii) chemical vapor deposition.

As previously indicated, the barrier layer is preferably at least partially made from a polymer, such as parylene. Preferably the barrier layer has a thickness in the range of from about 1 to about 20 nm.

The method preferably also includes the formation of an encapsulation layer at least partially encapsulating the OLED, the encapsulation layer being adapted to resist permeation by oxygen and/or moisture. Typically the encapsulation layer will be an organic encapsulation layer formed at least partially from a polymer. The encapsulation layer may have a thickness of from about 1 nm to about 30 μm. The encapsulation layer may typically be deposited by a process selected from:
(i) spin coating;
(ii) vacuum deposition; or
(iii) chemical vapor deposition.

When a barrier layer is formed on the EL layer, the cathode may be deposited by sputtering as the barrier layer will protect the EL layer from ion bombardment.

Throughout this specification, unless the context requires otherwise, the word "comprise," or variations such as "comprises" or "comprising," will be understood to imply the inclusion of a stated element, integer or step, or group of elements, integers or steps, but not the exclusion of any other element, integer or step, or group of elements, integers or steps.

Any discussion of documents, acts, materials, devices, articles, or the like, that has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

In order that the present invention may be more clearly understood, preferred forms will be described with reference to the following drawings and examples.

DETAILED DESCRIPTION OF THE INVENTION

Figure 1:
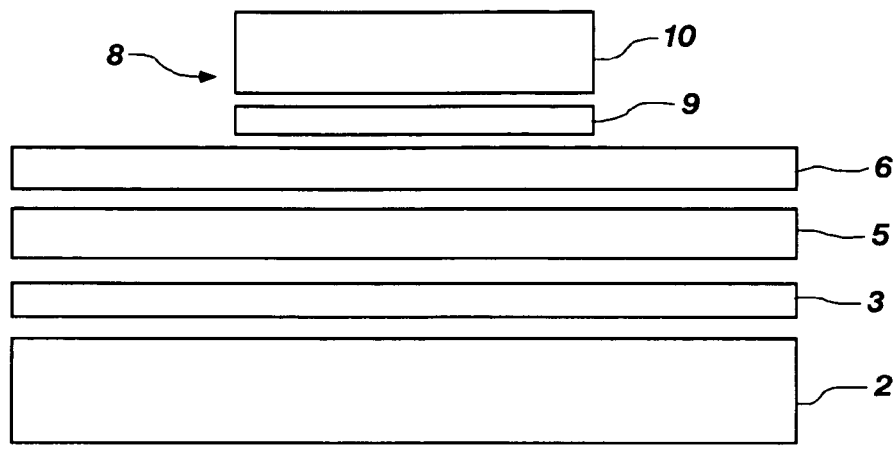
FIG. 1 is a schematic cross-sectional view of a simple prior art OLED.
Figure 2:
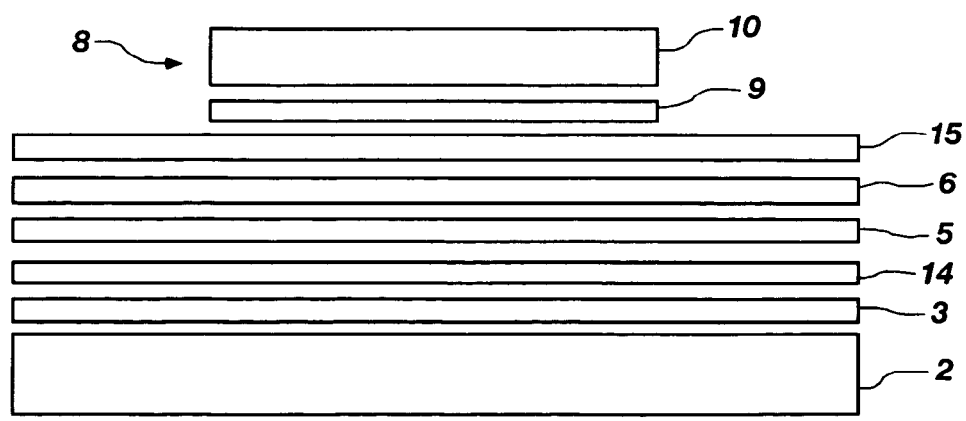
FIG. 2 is a schematic cross-sectional view of an advanced prior art OLED.
Figure 3:
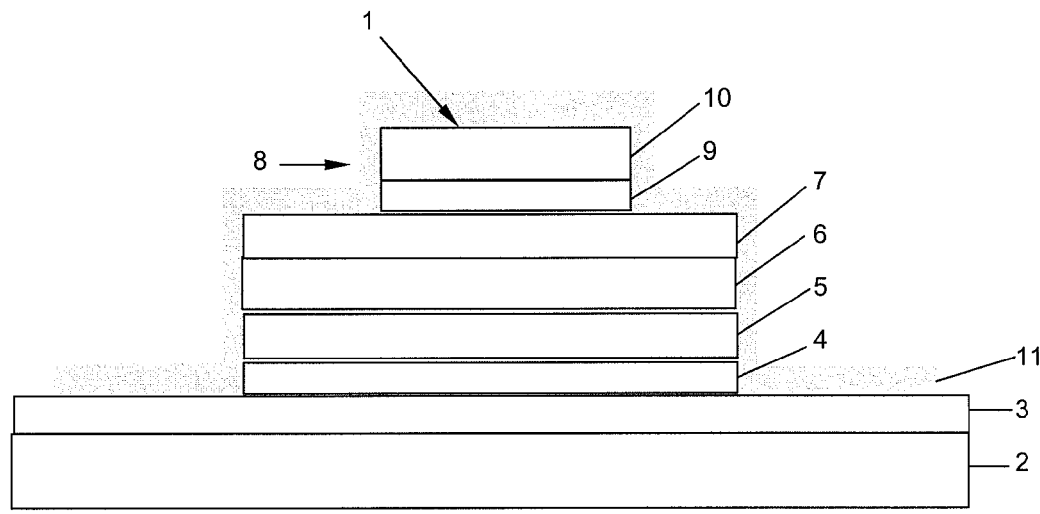
FIG. 3 is a schematic cross-sectional view of a first preferred embodiment of the present invention.

Referring to the drawings, FIG. 3 shows a schematic cross-sectional view of a first preferred embodiment of the OLED of the present invention. As seen in that Figure, the OLED 1 includes a number of layers disposed on a substrate 2. In this embodiment, the layers are arranged in the following order: an anode 3, a first oxygen/moisture barrier 4, a hole transport layer 5, and electroluminescent (EL) layer 6, a second oxygen/moisture barrier 7 and a cathode 8. In this embodiment, the cathode 8 includes a calcium cathode layer 9 and a silver/aluminum cathode layer 10. All of these layers are at least partially encapsulated by an encapsulation layer 11.

The first oxygen/moisture barrier 4 is adapted to resist permeation by oxygen and moisture and is also designed to inhibit metal migration. In this preferred embodiment the barrier 4 is an organic barrier made from a polymer selected from polyimides, TEFLON®, and parylene. TEFLON® is a trademark for polytetrafluoroethylene, a fluorinated ethylene propylene copolymer, a perfluoroalkoxy copolymer resin, or a copolymer of ethylene and tetrafluoroethylene. It is between 1 and 20 nm thick and is deposited on the anode 3 using any conventional coating process such as spin coating, vacuum deposition or chemical vapor deposition (CVD).

Although, in this preferred embodiment, the first oxygen/moisture barrier 4 is disposed between the anode 3 and the hole transport layer 5, effective results have also been achieved when it is disposed between the hole transport layer 5 and the EL layer 6.

This first oxygen/moisture barrier 4 has a moisture barrier property in the range of 0.1 g/m$^2$/day to 50 g/m$^2$/day at 39° C. at 95% RH. It is transparent in the visible wavelength range and is resistant to metal ion migration under electrical fields.

Because this barrier is adapted to resist permeation by oxygen and/or moisture it is able to prevent oxygen diffusion from the anode 3 to the hole transport layer 5 and the EL layer 6. It also acts as a thermal barrier film and is able to effectively reduce the heat transfer from the anode 3 to the EL layer 6 during operation of the OLED 1. This barrier 4 is preferably free of pinholes and other defects so that it provides a smooth morphology to allow the effective deposition of the hole transport layer 5.

This barrier 4 is also able to reduce the strong electric field produced at anode spikes and serves to increase the carrier injection efficiency by reducing the barrier height through the potential drop across the layers.

The second oxygen/moisture barrier 7 has substantially the same composition and properties as the first oxygen/moisture barrier 4, but it is disposed between the EL layer 6 and the cathode 8.

In its preferred form, this second barrier 7 is also adapted to resist permeation by oxygen and/or moisture and is therefore able to prevent oxygen and moisture from diffusing to the EL layer 6 and reacting with the cathode 8.

This second barrier 7 should also be free of pinholes and other defects so that it can provide a smooth morphology for deposition of the cathode 8.

As discussed earlier, the preferred method of depositing a cathode on an OLED is by the process known as "sputtering." However, this technique tends to damage the EL layer thereby reducing the EL efficiency of the device. In this preferred embodiment, since the second oxygen/moisture barrier 7 is deposited on the EL layer 6 it protects the EL layer, allowing the cathode 8 to be deposited by sputtering without damaging the EL layer 6. In this way, the second barrier 7 is able to protect the EL layer 6 from ion bombardment, radiation and metal migration. By depositing the cathode using sputtering techniques the cathode 8 can be produced with few or no pinholes.

Figure 4:
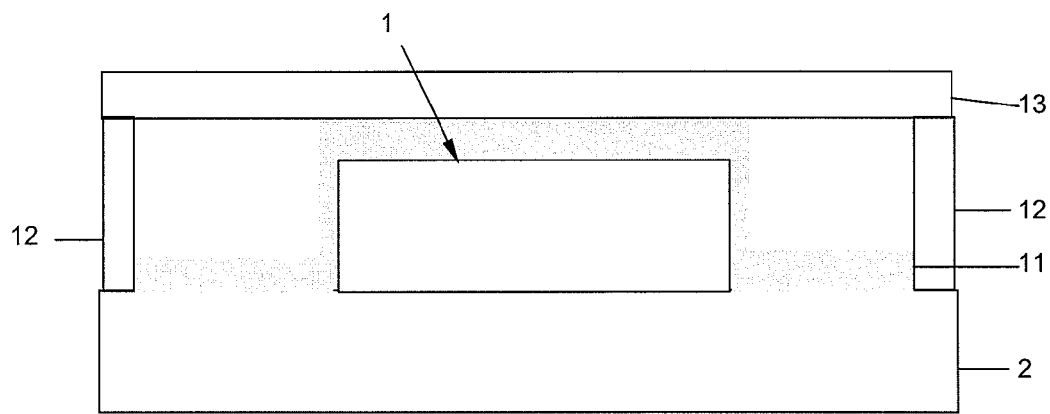
FIG. 4 is a simplified schematic cross-sectional view of the first preferred embodiment of the present invention clearly showing the encapsulation layer.

Turning to FIG. 4 there is shown a simplified schematic cross-sectional view of the preferred embodiment of the OLED of the present invention clearly showing the encapsulation layer 11. In that Figure, the OLED 1 is shown disposed on a substrate 2 and encapsulated by the encapsulation layer 11. A pair of epoxy seals 12 extends between the substrate 2 and a cover substrate 13 to enclose the OLED 1. The encapsulation layer 11 shown in both FIG. 3 and FIG. 4 is adapted to resist permeation by oxygen and/or moisture. In this preferred embodiment, it is an organic encapsulation layer 11 made at least partially from a polymer selected from polyimides, TEFLON®, and parylene. TEFLON® is a trademark for polytetrafluoroethylene a fluorinated ethylene propylene copolymer, a perfluoroalkoxy copolymer resin, or a copolymer of ethylene and tetrafluoroethylene. Of these polymers, the parylene series has produced the best results because it can be deposited at room temperature and it does not alter the electronic parameters of the OLED 1. It also has excellent step coverage and therefore provides conformal coverage of the OLED 1. The encapsulation layer 11 is preferably deposited by any conventional coating process such as spin coating, vacuum deposition or CVD and is deposited to a thickness ranging between 1 nm and 30 µm.

Because of the excellent oxygen and moisture barrier properties of the encapsulation layer 11, it is able to exhibit a moisture absorbency of less than 0.1% by weight. The encapsulation layer 11 provides an excellent barrier to moisture permeation and therefore protects the OLED 1 once it has been encapsulated. This encapsulation layer 11 allows the OLED 1 to be hermetically sealed thereby reducing the chance that the OLED will be oxidized as a result of the permeation of moisture and oxygen.

In this, and the following preferred embodiments, the substrate 2 is also adapted to resist permeation by oxygen and/or moisture and is at least partially made from a rigid or flexible material such as plastic or glass.

In addition, the cathode 8 (and the anode 3 in a multi-layer OLED architecture) is at least partially made from a cathode material which includes organic metals, inorganic metals, organic metal oxides and inorganic metal oxides. The cathode 8 (and the anode 3 in a multi-layer OLED architecture) is preferably deposited on the OLED by the technique known as sputtering so that it has few or no pinholes.

Figure 5:
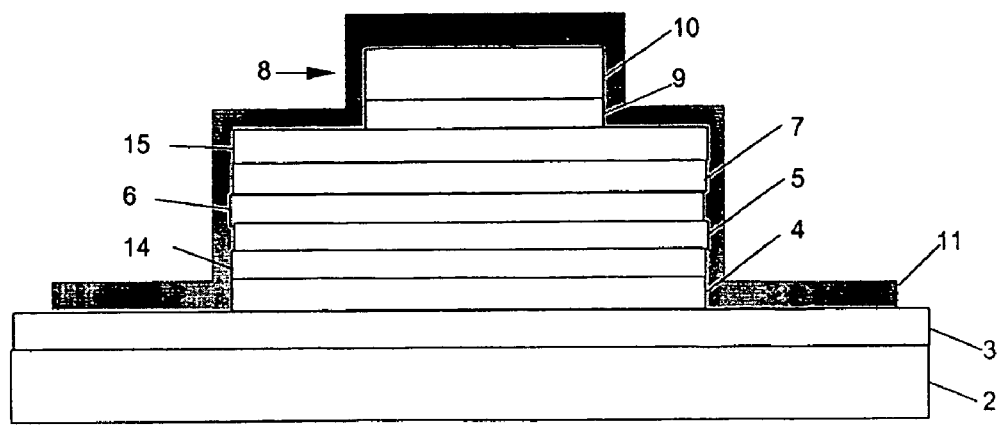
FIG. 5 is a schematic cross-sectional view of a second preferred embodiment of the OLED of the present invention.

Turning now to FIG. 5 there is shown a second preferred embodiment of the OLED of the present invention. This embodiment shows the first and second oxygen/moisture barriers 4, 7 and the encapsulation layer 11 used in a more advanced OLED.

The numbering used in this figure is the same as that used to describe the first preferred embodiment shown in FIG. 3. This second preferred embodiment has two additional layers, namely a dielectric layer 14 disposed between the anode 3 and the hole transport layer 5, and an electron injecting layer 15 disposed between the EL layer 6 and the cathode 8. In this preferred embodiment, the first oxygen/moisture barrier 4 is disposed between the anode 3 and the dielectric layer 14. The second oxygen/moisture barrier 7 is disposed between the EL layer 6 and the electron injecting layer 15.

Figure 6:
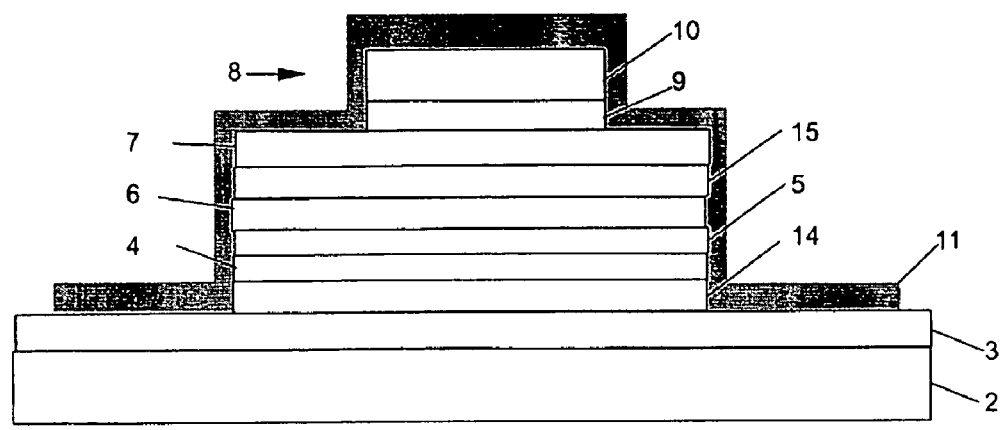
FIG. 6 is a schematic cross-sectional view of a third preferred embodiment of the OLED of the present invention.

The third preferred embodiment shown in FIG. 6 is similar to the second preferred embodiment, except that the first oxygen/moisture barrier 4 is disposed between the dielectric layer 14 and the hole transport layer 5, and the second oxygen/moisture barrier 7 is disposed between the electron injecting layer 15 and the cathode 8. Alternative embodiments with combinations of these and other arrangements of the first and second oxygen/moisture barriers 4, 7 are also envisaged. Further embodiments including more than 2 oxygen/moisture barriers are also envisaged.

In these preferred embodiments, the thickness of the dielectric layer is within tunneling range. Furthermore, the dielectric layer is adapted to lower the effective barrier height for electron injection and is therefore able to enhance the luminescence quantum efficiency of the OLED.

It will be appreciated from the foregoing discussion that by interposing a number of oxygen/moisture barriers within the OLED and applying an encapsulation layer around the OLED, the formation and growth of dark spots is significantly reduced. The result is an OLED with significantly improved performance and lifespan that may be used in any number of applications, including the commercial production of flat panel displays.

The inventors have found that, by using the barriers and encapsulation layers described above, the number of dark spots formed in an OLED have been reduced by a factor of 100.

The present invention therefore addresses the causes of dark spot formation and growth. The problem of cathode defects such as pinholes is addressed by the second oxygen/moisture barrier acting as a protective layer over the EL layer, allowing the calcium electrode to be deposited by sputtering without damaging the EL layer.

The problem of oxygen and moisture diffusion through the layers of the OLED is addressed by the first and second oxygen/moisture barriers. They act to reduce the diffusion of oxygen and moisture from the underlying layers to the cathode, thereby reducing the gaseous evolution caused by moisture reacting with the Ca electrode.

The barriers also address the problem of metal migration. They reduce the migration of metal, thereby reducing the likelihood that sharp spikes will form, inhibiting the deterioration of the polymer and limiting the occurrence of short circuits.

The problem of excessive heat build up is addressed because the barriers act as thermal barrier films to effectively reduce the heat transfer from the anode to the EL layer during the operation of the OLED.

The barriers also provide a smoother surface for the deposition of subsequent layers, thereby enhancing the quality of the OLED.

Furthermore, the encapsulation layer serves to protect the device from intrinsic and external ingress of moisture and oxygen.

An additional advantage of the barriers is that they increase the quantum efficiency of the device by more accurately matching the energy work functions of the metals in the device with the LUMO or HOMO of the polymers in the device.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. An organic light emitting diode (OLED), comprising:
   an anode disposed on a substrate;
   a cathode;
   an electroluminescent (EL) layer disposed between the anode and the cathode;
   a hole transport layer disposed between the anode and the EL layer;
   an electron injecting layer disposed between the EL layer and the cathode; and
   at least one dielectric organic barrier layer disposed between and in contact with
      the cathode and the electron injecting layer,
      the at least one dielectric organic barrier layer having a structure to at least one of:
         resist permeation by oxygen;
         resist permeation by moisture; and
         inhibit metal migration.

2. An OLED according to claim 1, further comprising at least another dielectric organic barrier layer disposed between and in contact with the EL layer and the cathode.

3. An OLED according to claim 1, further comprising at least another dielectric organic barrier layer disposed between either:
   the anode and the hole transport layer; or
   the hole transport layer and the EL layer.

4. An OLED according to claim 3, wherein the at least one dielectric organic barrier layer is disposed between the anode and the hole transport layer and in contact with at least one of the anode and the hole transport layer.

5. An OLED according to claim 1, wherein the at least one dielectric organic barrier layer is substantially transparent in the visible wavelength range.

6. An OLED according to claim 1, wherein the at least one dielectric organic barrier layer inhibits metal ion migration under electrical fields.

7. An OLED according to claim 1, wherein the at least one dielectric organic barrier layer has a moisture barrier property in a range of from about 0.1 g/m²/day to about 50 g/m²/day at about 39° C.

8. An OLED according to claim 1, wherein a thickness of the at least one dielectric organic barrier layer lies in a range of from 1 nm to 20 nm.

9. An OLED according to claim 1, further comprising an encapsulation layer at least partially encapsulating the OLED, the encapsulation layer structured to resist permeation by oxygen and/or moisture.

10. An OLED according to claim 1, wherein the at least one dielectric organic barrier layer is deposited by a coating technique including:
    spin coating;
    vacuum deposition; or
    chemical Vapor deposition.

11. An OLED according to claim 9, wherein the encapsulation layer is at least partially made from a polymer.

12. An OLED according to claim 9, wherein the encapsulation layer is an organic encapsulation layer.

13. An OLED according to claim 12, wherein the organic encapsulation layer is at least partially made from a polymer.

14. An OLED according to claim 9, wherein a thickness of the encapsulation layer lies in a range of from 1 nm to 30 μm.

15. An OLED according to claim 9, wherein the encapsulation layer is deposited by a coating technique including:
    spin coating;
    vacuum deposition; or
    chemical vapor deposition.

16. An OLED according to claim 11, wherein the polymer is selected from the group consisting of:
    polyimides;
    polytetrafluoroethylene, a fluorinated ethylene propylene copolymer, a perfluoroalkoxy copolymer resin, or a copolymer of ethylene and tetrafluoroethylene; and
    parylene.

17. An OLED according to claim 11, wherein the polymer is parylene.

18. An OLED according to claim 1, wherein the substrate is structured to resist permeation by at least one of oxygen and moisture and is at least partially made from a rigid or flexible material.

19. An OLED according to claim 18, wherein the substrate is formed of plastic or glass.

20. An OLED according to claim 1, wherein a thickness of the at least one dielectric organic barrier layer is within tunneling range.

21. An OLED according to claim 20, wherein the at least one dielectric organic barrier layer is structured to lower an effective barrier height for electron injection and enhance a luminescence quantum efficiency of the OLED.

22. An OLED according to claim 1, wherein at least one of the cathode and the anode is at least partially made from at least one of the following materials:
    organic metals;
    inorganic metals;
    organic metal oxides; and
    inorganic metal oxides.

23. An OLED according to claim 22, wherein the anode is formed of indium tin oxide.

24. An OLED according claim 22, wherein the cathode is formed of calcium, magnesium, silver, aluminum, alloys of at least two of these metals, or lithium alloys.

25. An OLED according to claim 22, wherein the cathode is at least partially formed by sputtering.

26. An OLED according to claim 25, wherein the cathode has few or no pinholes.

27. An OLED according to claim 25, wherein at least one of the at least one dielectric organic barrier layer is a protective barrier layer disposed between and in contact with the EL layer and the cathode and is structured to protect the EL layer from damage due to effects of the sputtering process.

28. An OLED according to claim 27, wherein the protective barrier layer is structured to protect the EL layer from damage due to at least one of:
    ion bombardment;
    radiation; and
    metal migration.

29. An organic light emitting diode (OLED), comprising:
    an anode disposed on a substrate;
    a cathode;
    an electroluminescent (EL) layer disposed between the anode and the cathode;
    a hole transport layer disposed between the anode and the EL layer;
    at least one dielectric organic barrier layer disposed between and in contact with the EL layer and
       the cathode, the at least one dielectric organic barrier layer having a structure to at least one of:
          resist permeation by oxygen;
          resist permeation by moisture; and
          inhibit metal migration; and
    at least another dielectric organic barrier layer disposed between the hole transport layer and the anode.

30. An OLED according to claim 29, further comprising an encapsulation layer at least partially encapsulating the OLED, the encapsulation layer structured to resist permeation by at least one of oxygen and moisture.

31. An organic light emitting diode (OLED), comprising:
an anode disposed on a substrate;
a cathode;
an electroluminescent (EL) layer disposed between the anode and the cathode;
a hole transport layer disposed between the anode and the EL layer;
at least one dielectric organic barrier layer disposed between and in contact with either:
the anode and the hole transport layer; or
the hole transport layer and the EL layer;
the at least one dielectric organic barrier layer having a structure to at least one of:
resist permeation by oxygen;
resist permeation by moisture; and
inhibit metal migration; and
at least another dielectric organic barrier layer disposed between the hole transport layer and the anode.

32. An OLED according to claim 31, further comprising an encapsulation layer at least partially encapsulating the OLED, the encapsulation layer structured to resist permeation by oxygen and/or moisture.

33. A method of manufacturing an organic light emitting diode (OLED) comprising:
forming an anode on a substrate;
forming a hole transport layer above the anode;
forming an electroluminescent (EL) layer above the hole transport layer;
forming a electrode injecting layer above the EL layer;
forming a cathode above the EL layer; and
forming at least one dielectric organic barrier layer disposed between and in contact with
the electrode injecting layer and the cathode,
wherein the at least one dielectric organic barrier layer is structured to at least one of:
resist permeation by oxygen;
resist permeation by moisture; and
inhibit metal migration.

34. A method according to claim 33, wherein a first dielectric organic barrier layer is formed on the hole transport layer prior to formation of the EL layer.

35. A method according to claim 33, wherein a second dielectric organic barrier layer is formed on the EL layer prior to formation of the cathode.

36. A method according to claim 33, wherein a first dielectric organic barrier layer is formed on the anode and a second dielectric organic barrier layer is formed on the EL layer.

37. A method according to claim 33, wherein a first dielectric organic barrier layer is formed on the hole transport layer and a second dielectric organic barrier layer is formed on the EL layer.

38. A method according to claim 33, wherein each dielectric organic barrier layer is deposited by a coating technique including:
spin coating;
vacuum deposition; or
chemical vapor deposition.

39. A method according to claim 33, wherein the at least one dielectric organic barrier layer is at least partially made from a polymer.

40. A method according to claim 33, wherein the at least one dielectric organic barrier layer is formed having a thickness in a range of from about 1 nm to 20 mm.

41. A method according to claim 33, further including the formation of an encapsulation layer at least partially encapsulating the OLED and structured to resist permeation by at least one of oxygen and moisture.

42. A method according to claim 41, wherein the encapsulation layer is an organic encapsulation layer formed at least partially from a polymer.

43. A method according to claim 42, wherein the organic encapsulation layer is formed having a thickness of from about 1 nm to about 30 μm.

44. A method according to claim 41, wherein the encapsulation layer is deposited by a process selected from:
spin coating;
vacuum deposition; or
chemical vapor deposition.

45. A method according to claim 33, wherein the cathode is formed by sputtering.

* * * * *

UNITED STATES PATENT AND TRADEMARK OFFICE
CERTIFICATE OF CORRECTION

PATENT NO. : 7,733,008 B2  
APPLICATION NO. : 10/497427  
DATED : June 8, 2010  
INVENTOR(S) : Lin Ke, Senthil Kumar Ramadas and Soo Jin Chua Page 1 of 1

It is certified that error appears in the above-identified patent and that said Letters Patent is hereby corrected as shown below:

On the title page:
In ITEM (73)   change "Assignee:" to --Assignees:--

After "Agency for Science, Technology and Research, Singapore (SG)," please add a second assignee as follows:

--and National University of Singapore, Singapore (SG)--

Signed and Sealed this
Eleventh Day of September, 2012

David J. Kappos
*Director of the United States Patent and Trademark Office*